(12) United States Patent
Shih et al.

(10) Patent No.: US 8,008,135 B2
(45) Date of Patent: *Aug. 30, 2011

(54) METHOD FOR MANUFACTURING PIXEL STRUCTURE

(75) Inventors: Chih-Hung Shih, Hsinchu (TW); Chih-Chun Yang, Hsinchu (TW); Ming-Yuan Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/342,026

(22) Filed: Dec. 22, 2008

(65) Prior Publication Data

US 2009/0104722 A1 Apr. 23, 2009

Related U.S. Application Data

(62) Division of application No. 11/942,732, filed on Nov. 20, 2007, now Pat. No. 7,670,883.

(30) Foreign Application Priority Data

Jan. 22, 2007 (TW) ................................ 96102271 A (51) Int. Cl.
*H01L 21/20* (2006.01)

(52) U.S. Cl. ................................ 438/149; 257/E21.535
(58) Field of Classification Search .................. 438/141, 438/142, 149, 158, 606, 618, 586, 597, 608, 438/690, 759
See application file for complete search history.

(56) References Cited

U.S. PATENT DOCUMENTS 5,580,473 A * 12/1996 Shinohara et al. ......... 219/121.69
2006/0145161 A1 * 7/2006 Lee et al. ........................ 257/72

* cited by examiner

*Primary Examiner* — Savitr Mulpuri
(74) *Attorney, Agent, or Firm* — Jianq Chyun IP Office (57) ABSTRACT

A method for manufacturing a pixel structure includes providing a substrate having an active device thereon and forming a dielectric layer covering the active device. The dielectric layer has a contact hole disposed over the active device. Next, a first photoresist layer is formed on the dielectric layer over the active device, and a transparent conductive layer is formed to cover a portion of the dielectric layer and the first photoresist layer. The transparent conductive layer is electrically connected to the active device via the contact hole. Besides, the transparent conductive layer is irradiated with use of a laser beam, and a portion of the transparent conductive layer on the first photoresist layer is removed, such that the other portion of the transparent conductive layer on the portion of the dielectric layer forms a pixel electrode. The first patterned photoresist layer is then removed.

11 Claims, 8 Drawing Sheets

METHOD FOR MANUFACTURING PIXEL STRUCTURE

CROSS-REFERENCE TO RELATED APPLICATION

This application is a divisional of an application Ser. No. 11/942,732, filed on Nov. 20, 2007, now pending, which claims the priority benefit of Taiwan application serial no. 96102271, filed on Jan. 22, 2007. The entirety of each of the above-mentioned patent applications is hereby incorporated by reference herein and made a part of this specification.

BACKGROUND OF THE INVENTION

1. Field of the Invention

The present invention relates to a method for manufacturing a pixel structure, and more particularly to a method for manufacturing a pixel structure with use of a relatively fewer number of photomasks.

2. Description of Related Art

With the progress of modern visual information technology, various types of displays have been widely adopted in consumers' electronic products such as cell phones, notebook computers, digital cameras, and personal digital assistants (PDAs). Among these displays, liquid crystal displays (LCDs) and organic electroluminescence displays (OELDs) have become the mainstream on the market due to their advantages of lightness, compactness, and lower power-consumption. The manufacturing processes for both the LCDs and the OELDs include forming a pixel structure array over a substrate through a semiconductor manufacturing process.

Figure 1A:
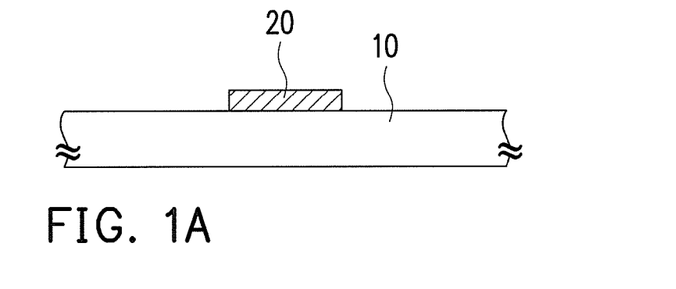
FIGS. 1A through 1G are cross-sectional views depicting a process of manufacturing a conventional pixel structure.
Figure 1B:
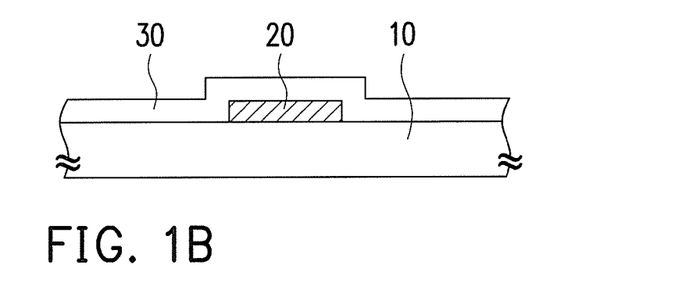
Figure 1C:
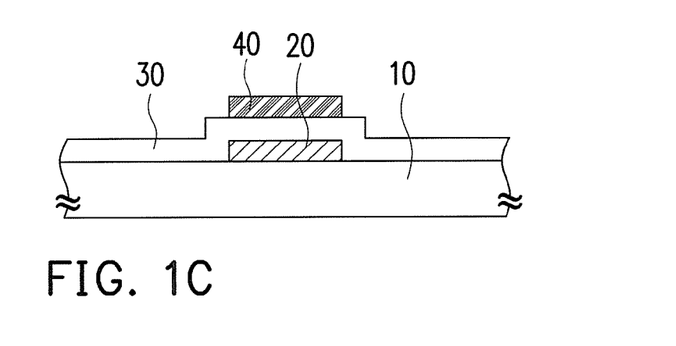
Figure 1D:
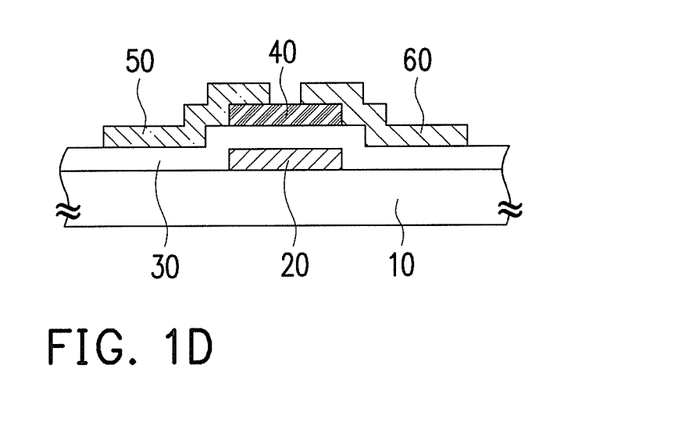
Figure 1E:
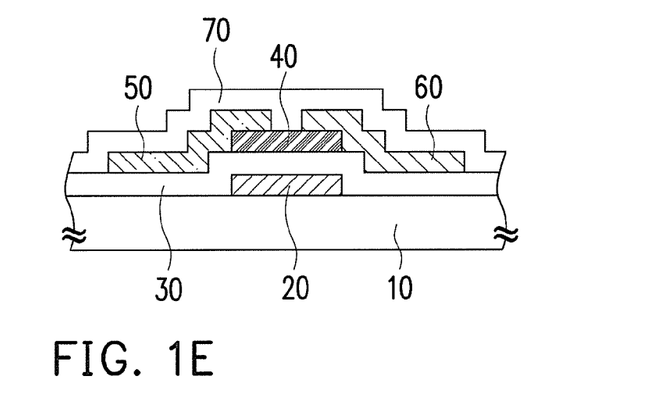
Figure 1F:
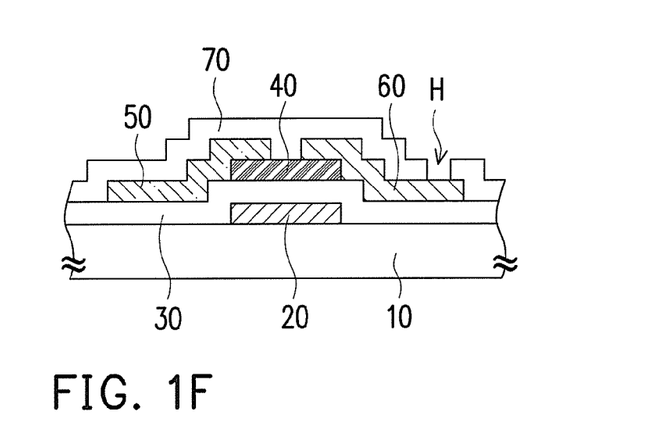
Figure 1G:
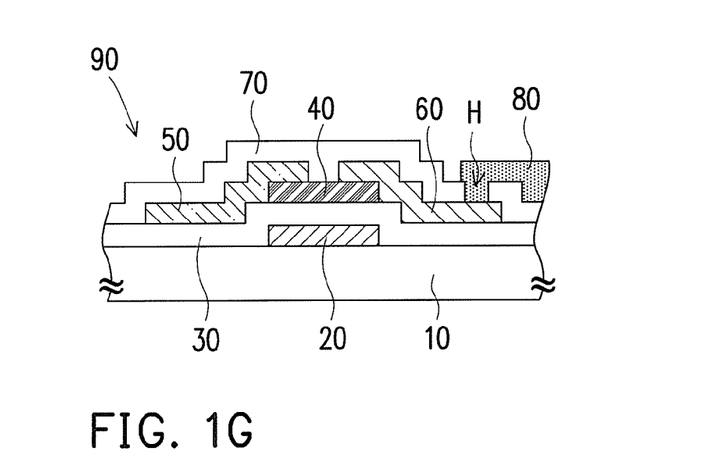

FIGS. 1A through 1G are cross-sectional views depicting a process of manufacturing a conventional pixel structure. First, referring to FIG. 1A, a gate 20 is formed on a substrate 10. Next, referring to FIG. 1B, a first dielectric layer 30 is formed on the substrate 10 to cover the gate 20. Thereafter, referring to FIG. 1C, a channel layer 40 is formed on the first dielectric layer 30. Afterwards, referring to FIG. 1D, a source 50 and a drain 60 are formed on the channel layer 40. Referring to FIG. 1E, a second dielectric layer 70 is then formed over the substrate 10 to cover the channel layer 40, the source 50 and the drain 60. Next, referring to FIG. 1F, a contact hole H is constructed in the second dielectric layer 70. After that, referring to FIG. 1G, a pixel electrode 80 is formed on the second dielectric layer 70. The pixel electrode 80 is partly filled in the contact hole H and is electrically connected to the drain 60. Up to here, the fabrication of the pixel structure 90 is completed.

To sum up, the fabrication process of the pixel structure 90 is mainly carried out by forming the gate 20 with use of a first photomask, forming the channel layer 40 with use of a second photomask, forming the source 50 and the drain 60 with use of a third photomask, forming the contact hole H with use of a fourth photomask, and forming the pixel electrode 80 with use of a fifth photomask. Accordingly, the conventional five-photomask process of fabricating the pixel structure 90 is rather complicated and time-consuming, which leads to higher risk of defects and lower yield of the pixel structure 90. In addition, with the complicated manufacturing process and excessive time consumed for fabrication, the total manufacturing costs arisen from the fixed costs on the machines or the material costs are then increased.

SUMMARY OF THE INVENTION

The present invention is directed to a method for manufacturing a pixel structure with use of a relatively fewer number of photomasks. Said method is adapted to decrease the number of the photomasks required by the manufacturing process and further to reduce the manufacturing costs.

To embody the present invention, a method for manufacturing a pixel structure is provided. The method includes providing a substrate on which an active device is already configured. Next, a dielectric layer is formed on the substrate to cover the active device. Then, a first photoresist layer is formed on the dielectric layer. The first photoresist layer is in various thicknesses and has an opening located over the active device. Thereafter, an etching process is performed with use of the first photoresist layer as a mask, so as to form a contact hole in the dielectric layer via the opening. Afterwards, the thickness of the first photoresist layer is reduced to remove a portion of the first photoresist layer and expose a portion of the dielectric layer. Next, a transparent conductive layer is formed to cover the portion of the dielectric layer and the remained first photoresist layer, and the transparent conductive layer is electrically connected to the active device via the contact hole. The transparent conductive layer on the remained first photoresist layer is then removed, such that the transparent conductive layer on the portion of the dielectric layer forms a pixel electrode. After that, the remained first photoresist layer is removed.

According to the method for manufacturing the pixel structure of the present invention, the active device on the substrate is, for example, a thin film transistor (TFT), and the method of forming the TFT includes, for example, forming a gate on the substrate at first. Then, a gate insulating layer is formed on the substrate to cover the gate. Next, a channel layer and a source/drain are formed on the gate insulating layer over the gate. The source/drain is disposed on the channel layer at two sides of the gate. More specifically, the method of forming the gate includes, for example, forming a first metal layer on the substrate first and then patterning the first metal layer to form the gate.

In addition, the channel layer and the source/drain are formed in a same photomask process, for example. Particularly speaking, the method of forming the channel layer and the source/drain includes, for example, forming a semiconductor layer on the gate insulating layer first and then forming a second metal layer on the semiconductor layer. Next, a second photoresist layer is formed on the second metal layer over the gate. The second photoresist layer is divided into a first photoresist block and a second photoresist block located at two sides of the first photoresist block, and the thickness of the first photoresist block is less than the thickness of the second photoresist block. Thereafter, a first etching process is performed on the second metal layer and the semiconductor layer with use of the second photoresist layer as the mask. Afterwards, the thickness of the second photoresist layer is reduced until the first photoresist block is thoroughly removed. Eternally, a second etching process is performed on the second metal layer with use of the remained second photoresist block as the mask, such that the remained second metal layer constructs the source/drain while the remained semiconductor layer constructs the channel layer. According to other embodiments, the method of forming the channel layer and the source/drain further includes forming an ohmic contact layer on a surface of the semiconductor layer after the semiconductor layer is formed. Then, the ohmic contact layer corresponding to an outside area of the second photoresist block is removed through the first etching process and the second etching process. Moreover, the method of reducing the thickness of the second photoresist layer includes performing an ashing process.

According to the method for manufacturing the pixel structure of the present invention, the method of forming the dielectric layer includes, for example, forming a silicon nitride layer through a chemical vapor deposition (CVD) process.

According to the method for manufacturing the pixel structure of the present invention, the method of reducing the thickness of the first photoresist layer includes, for example, performing an ashing process.

According to the method for manufacturing the pixel structure of the present invention, the method of forming the transparent conductive layer includes, for example, forming an indium tin oxide (ITO) layer or an indium zinc oxide (IZO) layer through a sputtering process.

According to the method for manufacturing the pixel structure of the present invention, the method of removing the transparent conductive layer on the remained first photoresist layer includes irradiating the transparent conductive layer with use of a laser beam. Here, energy of the laser beam ranges from 10 mJ/cm$^2$ to 200 mJ/cm$^2$, and a wavelength of the laser beam ranges from 100 nm to 400 nm.

In comparison with the conventional five-photomask manufacturing process, the three-photomask process proposed in the present invention is capable of reducing the costs on the photomasks and of minimizing defects arisen from the complicated manufacturing process. Moreover, the manufacturing process proposed in the present invention is relatively simple in contrast with the conventional five-photomask manufacturing process.

In order to make the aforementioned and other features and advantages of the present invention more comprehensible, several embodiments accompanied with figures are described in detail below.

DESCRIPTION OF EMBODIMENTS

FIGS. 2A through 2L are schematic views depicting a method for manufacturing a pixel structure according to an embodiment of the present invention.

Figure 2A:
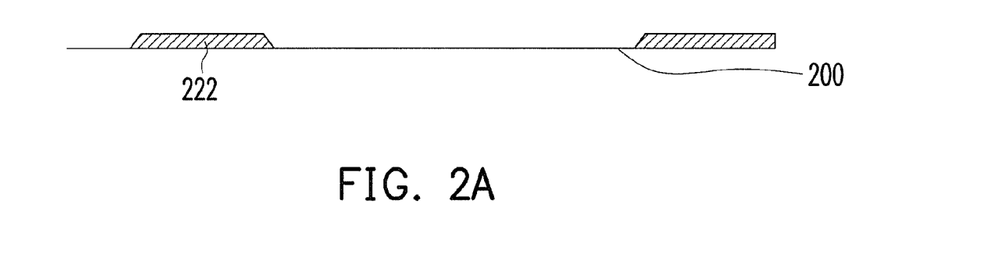
FIGS. 2A through 2L are schematic views depicting a method for manufacturing a pixel structure according to an embodiment of the present invention.

Referring to FIGS. 2A to 2D, a substrate 200 is provided first, and an active device 210 is already configured on the substrate 200. The material of the substrate 200 is glass, for example. As shown in FIGS. 2A to 2D, the active device 210 disclosed in the present embodiment is a thin film transistor (TFT) 220, for example. The TFT 220 is composed of a gate 222, a channel layer 226', a source 228a and a drain 228b. The method of forming the TFT 220 includes, as shown in FIG. 2A, forming the gate 222 on the substrate 200. Here, the method of forming the gate 222 includes, for example, forming a first metal layer on the substrate 200 through a sputtering process or an evaporation process. The first metal layer is then patterned to form the gate 222.

Figure 2B:
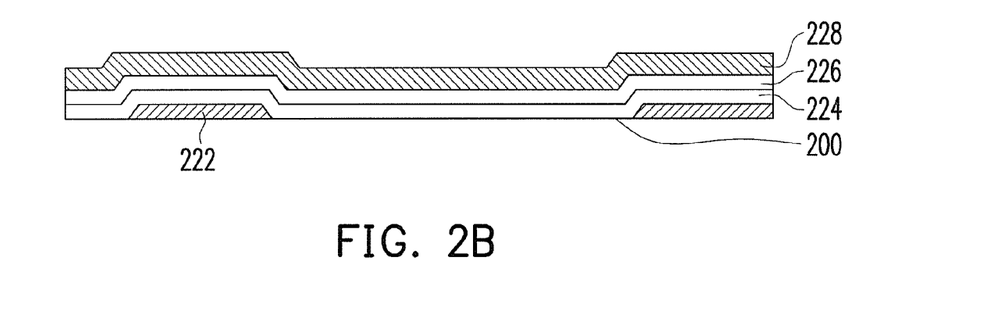

Next, as indicated in FIG. 2B, a gate insulating layer 224 covering the gate 222 is formed on the substrate 200. According to the present embodiment, a chemical vapor deposition (CVD) process is implemented to configure the gate insulating layer 224 on the substrate 200, and the material of the gate insulating layer 224 is, for example, silicon oxide, silicon nitride or silicon nitride oxide. Thereafter, a semiconductor layer 226 is formed on the gate insulating layer 224, and a second metal layer 228 is configured on the semiconductor layer 226.

Figure 2C:
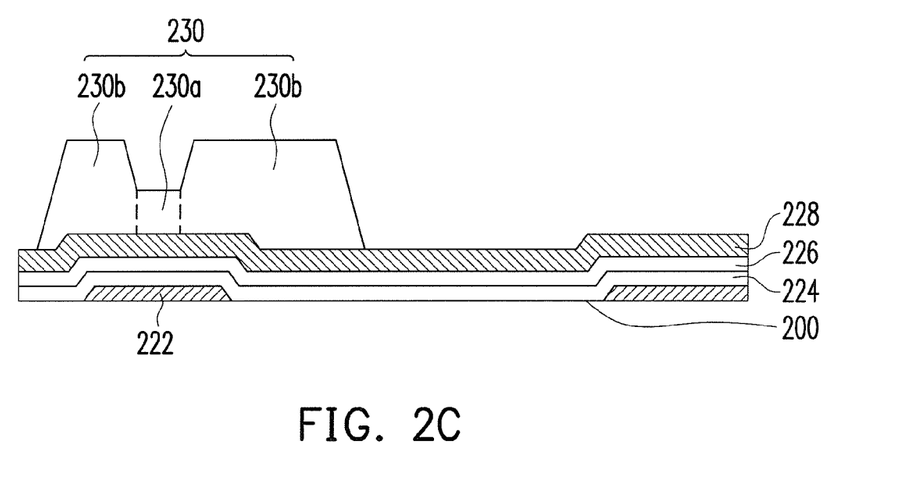

FIG. 2C is a schematic cross-sectional view depicting the pixel structure in which the channel layer 226' and the source 228a/drain 228b are formed through a patterning process. As indicated in FIG. 2C, a second photoresist layer 230 is formed on the second metal layer 228 over the gate 222. The second photoresist layer 230 may be divided into a first photoresist block 230a and a second photoresist block 230b located at two sides of the first photoresist block 230a, and the thickness of the first photoresist block 230a is less than the thickness of the second photoresist block 230b. Thereafter, a first etching process is performed on the second metal layer 228 and the semiconductor layer 226 with use of the second photoresist layer 230 as a mask. Afterwards, the thickness of the second photoresist layer 230 is reduced until the first photoresist block 230a is thoroughly removed. A second etching process is then performed on the second metal layer 228 with use of the remained second photoresist block 230b as the mask.

Figure 2D:
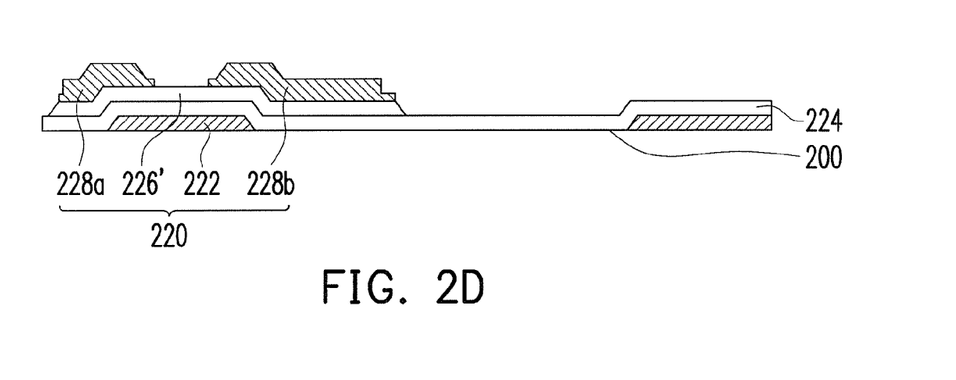

FIG. 2D is a schematic cross-sectional view depicting the pixel structure in which the first and the second etching processes are performed and the remained photoresist layer is removed. As indicated in FIG. 2D, after said etching processes are performed, the remained second metal layer 228 constructs the source 228a/drain 228b while the remained semiconductor layer 226 constructs the channel layer 226'. Up to here, the formation of the TFT 220 on the substrate 200 is completed. In the present embodiment, the first and the second etching processes are, for example, a wet etching process, while a dry etching process may also be carried out in other embodiments. Additionally, in the present embodiment, the method of reducing the thickness of the photoresist layer includes, for example, performing an ashing process, while said method may include performing the wet etching process or the dry etching process as well in other embodiments.

In the present embodiment, the channel layer 226' and the source 228a/drain 228b in the TFT 220 are constructed through a same half-tone mask process or a same gray-tone mask process, for example. However, in other embodiments, the method of forming the channel layer 226' and the source 228a/drain 228b further includes forming an ohmic contact layer (not shown) on a surface of the semiconductor layer 226 after the semiconductor layer 226 is formed. Then, the ohmic contact layer (not shown) corresponding to an outside area of the second photoresist block 230 is removed through the first etching process and the second etching process. Based on the above, the method of forming the channel layer 226' and the source 228a/drain 228b is not limited in the present invention.

Figure 2E:
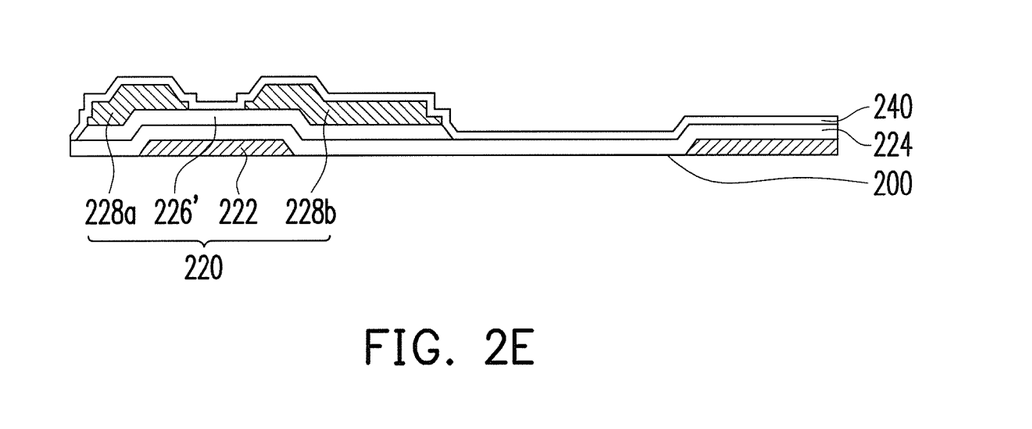

FIG. 2E is a schematic cross-sectional view depicting the pixel structure in which a dielectric layer covering the TFT is formed. After the formation of the TFT 220, a dielectric layer 240 covering the TFT 220 is formed on the substrate 200. The material of the dielectric layer 240 is, for example, silicon nitride or silicon oxide, and the dielectric layer 240 is thoroughly deposited on the substrate 200 thorough a physical vapor deposition (PVD) process or the CVD process, for example.

Figure 2F:
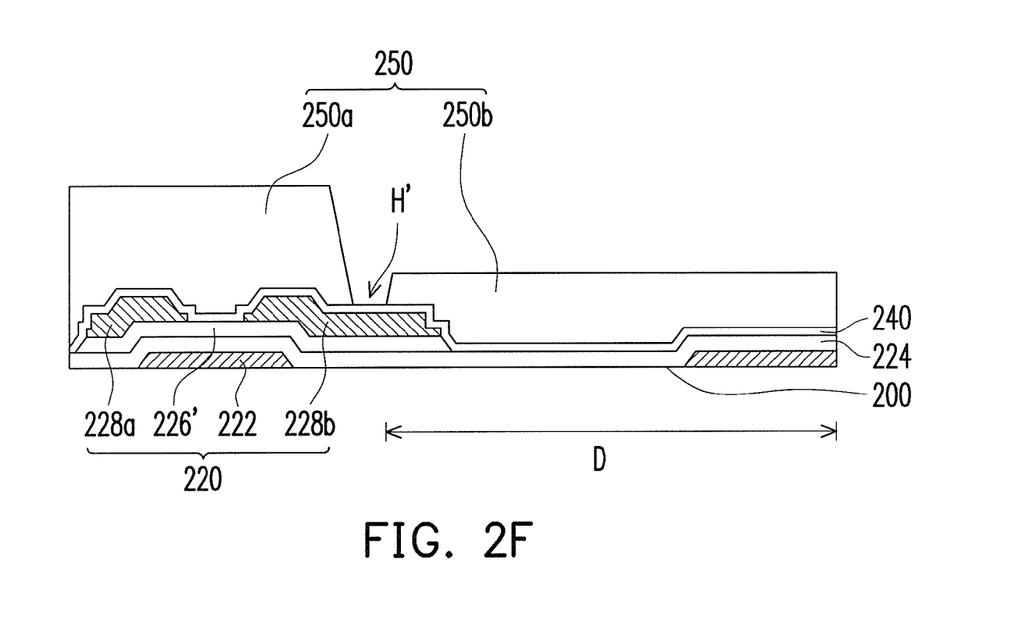

Subsequently, referring to FIG. 2F, a first photoresist layer 250 in various thicknesses is formed on the dielectric layer 240. In the present embodiment, the thickness of a first photoresist layer 250a disposed over a part of the TFT 220 exceeds the thickness of a first photoresist layer 250b disposed over a pixel display area D. Moreover, the first photoresist layer 250 has an opening H' located over the TFT 220. Next, please refer to FIG. 2G that is a schematic cross-sectional view depicting the pixel structure in which an etching process is performed with use of the first photoresist layer 250 as the mask. After the etching process is carried out with use of the first photoresist layer 250 as the mask, a contact hole 260 is then formed in the dielectric layer 240.

Figure 2G:
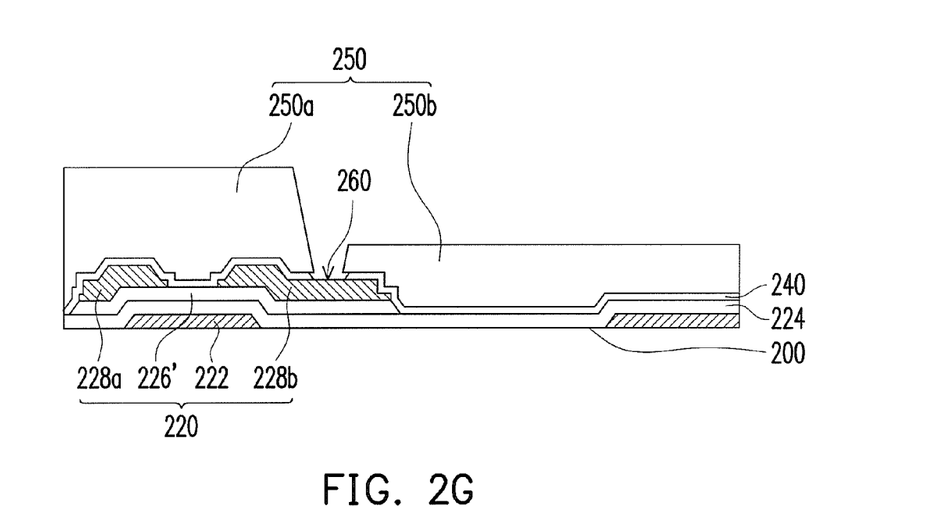
Figure 2H:
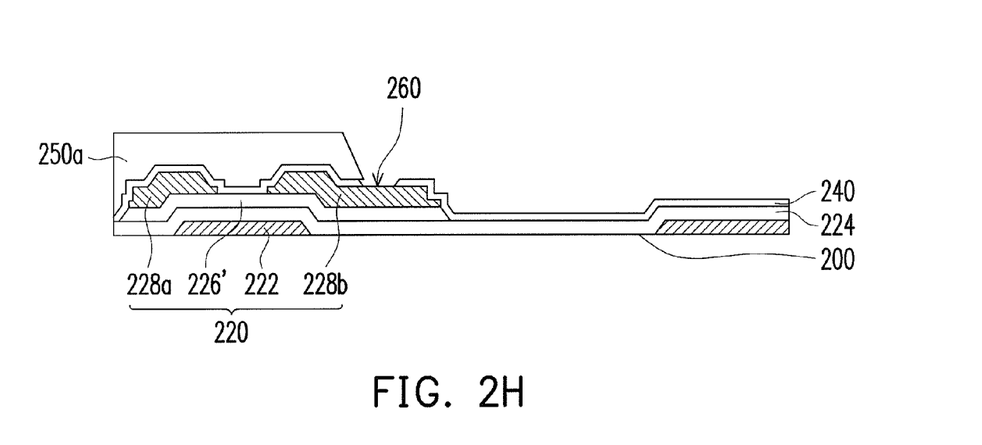

FIG. 2H is a schematic cross-sectional view of the pixel structure in which the thickness of the first photoresist layer 250 is reduced. As indicated in FIG. 2H, the thickness of the first photoresist layer 250b is less than the thickness of the first photoresist layer 250a disposed over the part of the TFT 220. Therefore, a portion of the first photoresist layer 250b is removed, and a portion of the dielectric layer 240 is exposed. In the present embodiment, the method of reducing the thickness of the portion of the first photoresist layer 250b includes, for example, performing the ashing process, while said method may include performing the wet etching process or other processes in other embodiments.

Figure 2I:
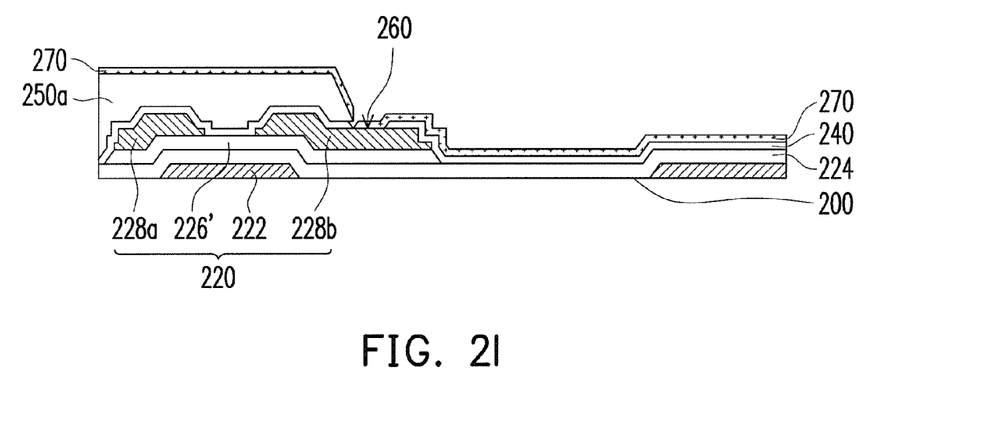

FIG. 2I is a schematic cross-sectional view of the pixel structure in which a transparent conductive layer 270 is thoroughly formed. As illustrated in FIG. 2I, the transparent conductive layer 270 covers the portion of the dielectric layer 240 and the remained first photoresist layer 250a. Besides, the transparent conductive layer 270 is electrically connected to the TFT 220 via the contact hole 260. In the present embodiment, the method of forming the transparent conductive layer 270 includes, for example, forming an indium tin oxide (ITO) layer or an indium zinc oxide (IZO) layer through the sputtering process.

Figure 2J:
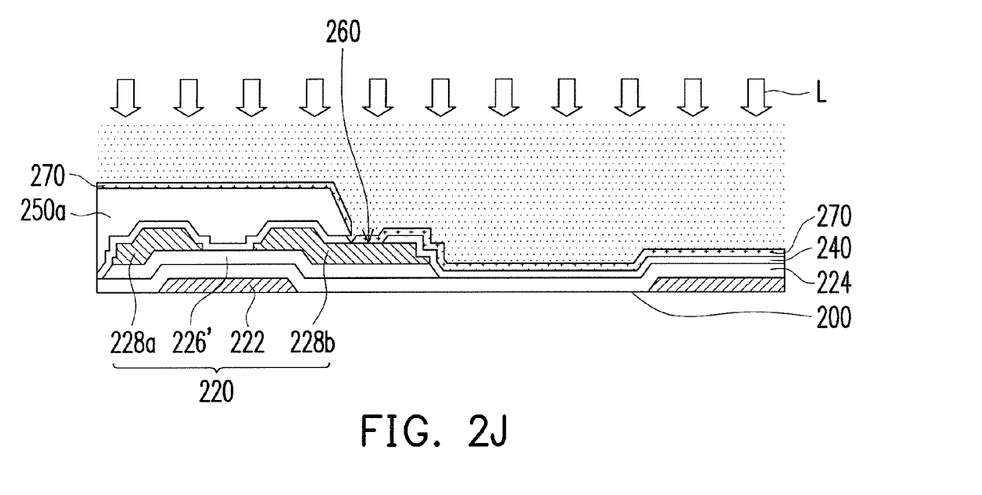

Thereafter, please refer to FIG. 2J that is a schematic cross-sectional view of the pixel structure in which a portion of a transparent electrode on the remained first photoresist layer is removed. In the present embodiment, the method of removing the transparent conductive layer 270 on the remained first photoresist layer 250a includes, for example, irradiating the transparent conductive layer 270 with use of a laser beam L. It can be understood from FIG. 2J that the transparent conductive layer 270 is thoroughly irradiated by the laser beam L; however, an adequate wavelength and an appropriate energy of the laser beam L may bring about different irradiating effects to the transparent conductive layer 270 on the remained first photoresist layer 250a and the transparent conductive layer 270 on the dielectric layer 240. In the present embodiment, the energy of the laser beam L adopted to implement a lift-off process on a portion of the transparent conductive layer 270 ranges from 10 mJ/cm$^2$ to 200 mJ/cm$^2$, and the wavelength of the laser beam L ranges from 100 nm to 400 nm.

Figure 2K:
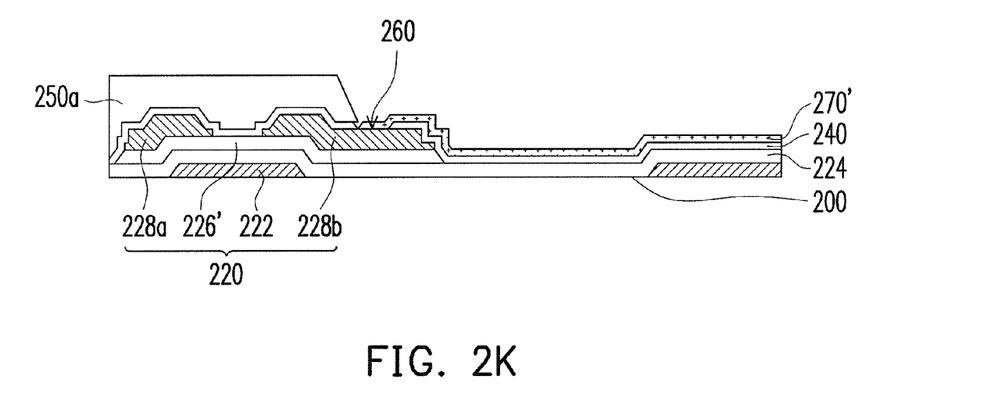

FIG. 2K is a schematic cross-sectional view depicting the pixel structure in which the laser beam with the adequate wavelength and the appropriate energy is employed to perform the irradiation. As indicated in FIG. 2K, the irradiation of the laser beam to the transparent conductive layer 270 on the remained first photoresist layer 250a poses a negative impact on the adhesive strength of the transparent conductive layer 270. Accordingly, the transparent conductive layer 270 disposed on a surface of the first photoresist layer 250a may lift off the surface of the first photoresist layer 250a. On the other hand, after irradiated by the laser beam, the transparent conductive layer 270 on the dielectric layer 240 remains, for the adhesive strength of the transparent conductive layer 270 is not deteriorated to a great extent. Thereby, the transparent conductive layer 270 on the dielectric layer 240 constructs a pixel electrode 270'. In the present embodiment, no additional photomask is required for patterning the pixel electrode 270'. Thus, compared with the conventional five-photomask manufacturing process, the method for manufacturing the pixel structure according to the present invention requires fewer photomasks, and the cost of manufacturing can then be reduced.

Figure 2L:
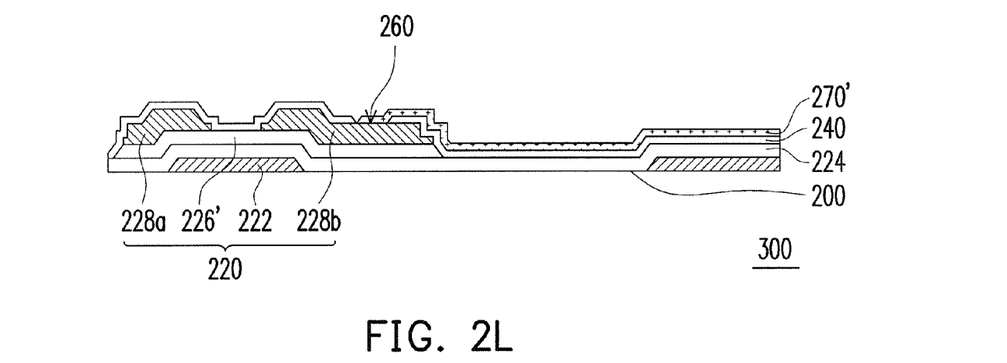

Please refer to FIG. 2L that is a schematic cross-sectional view of the pixel structure in which the remained first photoresist layer 250a is removed. In the present embodiment, the method of reducing the thickness of the remained first photoresist layer 250a includes, for example, performing the ashing process, while said method may include performing the wet etching process or other processes in other embodiments. After said process is completed, a pixel structure 300 is formed.

In view of the foregoing, only three photomasks are employed in said method for manufacturing the pixel structure 300. The first photomask process is carried out to define the gate 222 (as illustrated in FIG. 2A). The second photomask process is performed to define the channel layer 226' and the source 228a/drain 228b (as illustrated in FIG. 2D). And the third photomask process is implemented to define the contact hole 260 (as illustrated in FIG. 2G). In summary, the method for manufacturing the pixel structure provided by the present invention has at least the following advantages.

1. In comparison with the conventional five-photomask process, the method for manufacturing the pixel structure proposed by the present invention merely requires three photomasks. The reduced number of the photomasks is conducive to a decrease in the manufacturing costs.

2. The method for manufacturing the pixel structure provided by the present invention requires fewer photomasks to manufacture the pixel structure, which saves the time required for the fabrication of the pixel structure and reduces the manufacturing costs.

3. Thanks to fewer manufacturing processes, the occurrence of defects can be minimized and the yield of products is further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a pixel structure, comprising:
    providing a substrate having an active device formed thereon;
    forming a dielectric layer on the substrate to cover the active device, wherein the dielectric layer has a contact hole disposed over the active device;
    forming a first photoresist layer on the dielectric layer over the active device;
    forming a transparent conductive layer to cover a portion of the dielectric layer and the first photoresist layer, wherein the entire transparent conductive layer is electrically connected to the active device via the contact hole;
    irradiating the transparent conductive layer covering the portion of the dielectric layer and the first photoresist layer with use of a laser beam and removing a portion of the transparent conductive layer on the first photoresist layer, such that the other portion of the transparent conductive layer on the portion of the dielectric layer forms a pixel electrode; and
    removing the first patterned photoresist layer after the step of removing the portion of the transparent conductive layer.

2. The method of claim 1, wherein the active device is a thin film transistor (TFT).

3. The method of claim 2, wherein the method of forming the TFT comprises:
   forming a gate on the substrate;
   forming a gate insulating layer on the substrate to cover the gate; and
   performing a photomask process to form a channel layer and a source/drain on the gate insulating layer over the gate, wherein the source/drain is disposed on the channel layer at two sides of the gate.

4. The method of claim 3, wherein the method of forming the gate comprises:
   forming a first metal layer on the substrate; and
   patterning the first metal layer to form the gate.

5. The method of claim 3, wherein the method of forming the channel layer and the source/drain comprises:
   forming a semiconductor layer on the gate insulating layer;
   forming a second metal layer on the semiconductor layer;
   forming a second photoresist layer on the second metal layer over the gate, wherein the second photoresist layer is divided into a first photoresist block and a second photoresist block located at two sides of the first photoresist block, and the thickness of the first photoresist block is less than the thickness of the second photoresist block;
   performing a first etching process on the second metal layer and the semiconductor layer with use of the second photoresist layer as a mask;
   reducing the thickness of the second photoresist layer until the first photoresist block is thoroughly removed; and
   performing a second etching process on the second metal layer with use of the remained second photoresist block as the mask, such that the remained second photoresist layer constructs the source/drain while the remained semiconductor layer constructs the channel layer.

6. The method of claim 5, wherein the method of forming the channel layer and the source/drain further comprises:
   forming an ohmic contact layer on a surface of the semiconductor layer after the semiconductor layer is formed; and
   removing the ohmic contact layer corresponding to an outside area of the second photoresist block through the first etching process and the second etching process.

7. The method of claim 5, wherein the method of reducing the thickness of the second photoresist layer comprises performing an ashing process.

8. The method of claim 1, wherein the method of forming the dielectric layer comprises forming a silicon nitride layer through a chemical vapor deposition (CVD) process.

9. The method of claim 1, wherein the method of forming the transparent conductive layer comprises forming an indium tin oxide (ITO) layer or an indium zinc oxide (IZO) layer through a sputtering process.

10. The method of claim 1, wherein energy of the laser beam ranges from 10 mJ/cm$^2$ to 200 mJ/cm$^2$.

11. The method of claim 1, wherein a wavelength of the laser beam ranges from 100 nm to 400 nm.

* * * * *